(12) United States Patent
Kalisman

(10) Patent No.: US 11,142,684 B2
(45) Date of Patent: Oct. 12, 2021

(54) SYSTEMS AND METHODS FOR A HERMETICALLY SEALED QUANTUM DOT LIGHT EMITTING DIODE

(71) Applicant: Philip Taubman Kalisman, Palm Beach, FL (US)

(72) Inventor: Philip Taubman Kalisman, Palm Beach, FL (US)

( * ) Notice: Subject to any disclaimer, the term of this patent is extended or adjusted under 35 U.S.C. 154(b) by 87 days.

(21) Appl. No.: 16/485,569

(22) PCT Filed: Feb. 12, 2018

(86) PCT No.: PCT/US2018/017770
§ 371 (c)(1),
(2) Date: Aug. 13, 2019

(87) PCT Pub. No.: WO2018/148631
PCT Pub. Date: Aug. 16, 2018

(65) Prior Publication Data
US 2020/0048545 A1 Feb. 13, 2020

Related U.S. Application Data

(60) Provisional application No. 62/458,492, filed on Feb. 13, 2017.

(51) Int. Cl.
*H01L 33/50* (2010.01)
*C09K 11/02* (2006.01)
*H01L 33/56* (2010.01)
*B82Y 20/00* (2011.01)
*B82Y 40/00* (2011.01)

(52) U.S. Cl.
CPC .......... *C09K 11/025* (2013.01); *H01L 33/504* (2013.01); *H01L 33/505* (2013.01); *H01L 33/56* (2013.01); *B82Y 20/00* (2013.01); *B82Y 40/00* (2013.01); *H01L 2933/0041* (2013.01)

(58) Field of Classification Search
CPC ..... H01L 33/504; H01L 33/505; H01L 33/56; C09K 11/025
USPC ........................................... 257/98; 313/504
See application file for complete search history.

(56) References Cited

U.S. PATENT DOCUMENTS

| 2004/0150979 A1* | 8/2004 | Lambertini ......... H01L 51/5262 362/629 |
| 2005/0271811 A1* | 12/2005 | Douglas .................. C03C 17/36 427/248.1 |
| 2010/0053930 A1* | 3/2010 | Kim ...................... H01L 33/501 362/84 |

(Continued)

*Primary Examiner* — David Vu
*Assistant Examiner* — Brandon C Fox
(74) *Attorney, Agent, or Firm* — Haley Guiliano LLP

(57) ABSTRACT

Systems and methods for hermetically sealed quantum dots that may be positioned directly on top of the LED, so that a separate film is not needed to incorporate the quantum dots into a light, display, or other LED-based device. An enclosed quantum dot package can be incorporated directly on top of an LED die and packaged in the same packaging as the LED itself. Alternatively, the LED die may be encapsulated in the LED package, and the enclosed quantum dot package may be placed on top of the encapsulated LED. Alternatively, the enclosed quantum dot package may be separate from the encapsulated LED, e.g., included in a device as a separate layer from the LED package(s).

33 Claims, 3 Drawing Sheets

(56) References Cited

U.S. PATENT DOCUMENTS

| | | | |
|---|---|---|---|
| 2012/0132888 A1* | 5/2012 | Kwak | B82Y 20/00 |
| | | | 257/13 |
| 2012/0223635 A1* | 9/2012 | Mochizuki | H01L 51/5268 |
| | | | 313/512 |
| 2014/0340912 A1* | 11/2014 | Kang | F21V 9/00 |
| | | | 362/351 |
| 2016/0084476 A1 | 3/2016 | Koole et al. | |
| 2016/0218252 A1 | 7/2016 | Steckel et al. | |
| 2017/0025584 A1 | 1/2017 | Lee et al. | |
| 2019/0308332 A1* | 10/2019 | Ahn | B65G 47/91 |

* cited by examiner

SYSTEMS AND METHODS FOR A HERMETICALLY SEALED QUANTUM DOT LIGHT EMITTING DIODE

BACKGROUND

Quantum dots can be used in combination with light emitting diodes (LEDs) to create LEDs that produce light at finely tuned frequencies. Quantum dots (QD) are very small semiconductor particles whose optical and electronic properties differ from those of larger particles. Many types of quantum dots will emit light of specific frequencies if electricity or light is applied to them, and these frequencies can be precisely tuned by changing the dots' size, shape, and material, giving rise to many applications. For example, these types of quantum dots can be used in combination with light emitting diodes (LEDs) to create LEDs that produce light at finely tuned frequencies. LEDs with quantum dots can produce a much wider color gamut than LEDs with traditional fluorophores or organic LEDs (OLEDs). Quantum dot films have been used to manufacture televisions, and they can be used to create stand-alone high gamut white light sources. However, existing quantum dot films require large amounts of material and add a significant thickness to devices. Positioning the material containing the quantum dots closer to the LED would reduce the thickness; however, the high heat and light flux emitted by the LED degrades the quantum dots.

SUMMARY

Exposure to the heat and light emitted by LEDs combined with exposure to oxygen or moisture in the air will degrade quantum dots. However, if quantum dots are hermetically sealed so that they are not exposed to oxygen and/or moisture, they can withstand the heat and light flux from an LED. A package of hermetically sealed quantum dots may be positioned directly on top of the LED, so that a separate film is not needed to incorporate the quantum dots into a light, display, or other LED-based device. The enclosed quantum dot package can be incorporated directly on top of an LED die and packaged in the same packaging as the LED itself. Alternatively, the LED die may be encapsulated in the LED package, and the enclosed quantum dot package may be placed on top of the encapsulated LED. Alternatively, the enclosed quantum dot package may be separate from the encapsulated LED, e.g., included in a device as a separate layer from the LED package(s).

Systems and methods are disclosed herein for a hermetically sealed quantum dot (QD) light emitting diode. The QD LED comprises a light emitting diode die and a porous material having a plurality of pores positioned on top of the light emitting diode die. A quantum dot material is deposited within the plurality of pores of the porous material. A sealant is disposed on top of the quantum dot material and the porous material in order to hermetically seal the quantum dot material within the plurality of pores. This hermetic seal protects the quantum dots from moisture and oxygen, so they will not degrade despite being so close to the LED die.

In some embodiments, the porous material is porous anodic alumina. The porous anodic alumina may comprise a barrier layer and walls. For example, the porous anodic alumina may include an anodic alumina base and anodic alumina walls. Each of the plurality of pores may be formed by a portion of the anodic alumina base and a portion of the anodic alumina walls. The anodic alumina base and walls may form a test-tube like structure for each of the pores. The sealant may be a metal oxide, such as alumina.

In some embodiments, the QD LED further comprises LED packaging for housing the light emitting diode die, the porous material, the quantum dot material, and the sealant in a single unit.

In some embodiments, the quantum dot material includes a plurality of quantum dots suspended in at least one of a silicone, polymer, and/or epoxy. In other embodiments, the quantum dot material is formed by loading a quantum dot solution, wherein the quantum dot solution comprises a solvent and a plurality of quantum dots, into the plurality of pores. The solvent is evaporated, and, in some embodiments, a filler material such as a silicone, polymer, or epoxy is loaded into the pores to fill them.

In some embodiments, the quantum dot material includes red quantum dots and green quantum dots, the light emitting diode emits a blue light, and the system emits a white light. For example, the light emitting diode die emits a blue light, which combines with the red and green light emitted from the quantum dots so that the QD LED system emits a white light. The LED die and/or the quantum dots may be configured to emit any other color and/or combination of colors.

Additionally, methods for producing LEDs are disclosed herein. In some aspects, the methods may involve loading a plurality of quantum dots into a porous material and hermetically sealing the quantum dots within the porous material. The methods further include positioning the porous material with the hermetically sealed quantum dots above an LED die and encapsulating the LED die and the porous material with the hermetically sealed quantum dots in a single LED package.

In some embodiments, loading the plurality of quantum dots into the porous material involves forming a quantum dot suspension by suspending the plurality of quantum dots into a suspension material, loading the quantum dot suspension into a plurality of pores of the porous material, and curing the quantum dot suspension. In other embodiments, loading the plurality of quantum dots into the porous material involves forming a quantum dot solution comprising the plurality of quantum dots and a solvent, loading the quantum dot solution into a plurality of pores of the porous material, and evaporating the solvent from the plurality of pores of the porous material. In some embodiments, loading the plurality of quantum dots into the porous material may further comprise loading a filler material into the plurality of pores. In some embodiments, the method may further involve cutting the porous material with hermetically sealed quantum dots according to a size of the LED die.

Additionally, methods for producing hermetically sealed quantum dots are disclosed herein. In some embodiments, the methods involve loading a plurality of quantum dots into porous anodic alumina comprising a plurality of pores each having an opening, and sputtering a metal oxide over the openings of the plurality of pores of the porous anodic alumina loaded with quantum dots, such that the quantum dots are hermetically sealed within the plurality of pores. In some embodiments, additionally or alternatively, loading the plurality of quantum dots into the porous anodic alumina comprising the plurality of pores may comprise forming a quantum dot suspension by suspending the plurality of quantum dots into a suspension material, loading the quantum dot suspension into the plurality of pores of the porous anodic alumina, and curing the quantum dot suspension. In some embodiments, additionally or alternatively, loading the plurality of quantum dots into the porous anodic alumina comprising the plurality of pores may comprise forming a quantum dot solution comprising the plurality of quantum dots and a solvent, loading the quantum dot solution into the plurality of pores of the porous anodic alumina, and evaporating the solvent from the plurality of pores of the porous anodic alumina. In some embodiments, additionally or alternatively, loading the plurality of quantum dots into the porous anodic alumina may comprise loading a filler material into the plurality of the pores.

It should be noted that while the embodiments disclosed herein may refer to systems and methods incorporating LEDs, the systems and methods for hermetically sealed quantum dot material may be applied to any technical field or purpose in which hermetically sealed nanomaterials are desired (e.g., diagnostic testing or tagging). For example, hermetically sealed quantum dot material may be loaded onto a high value asset with a mix of a specific ratio of nanomaterials, and those nanomaterials could be probed for quantum dot material tags to validate authenticity. By hermetically sealing the quantum dot material, this tagging method would last longer and have less variability over time.

It should also be noted that the systems and methods described herein may be combined in one or more embodiments.

BRIEF DESCRIPTION OF THE DRAWINGS

The above and other features of the systems and methods described herein will be more apparent upon consideration of the following detailed description, taken in conjunction with the accompanying drawings in which.

DETAILED DESCRIPTION OF THE DRAWINGS

Figure 1:
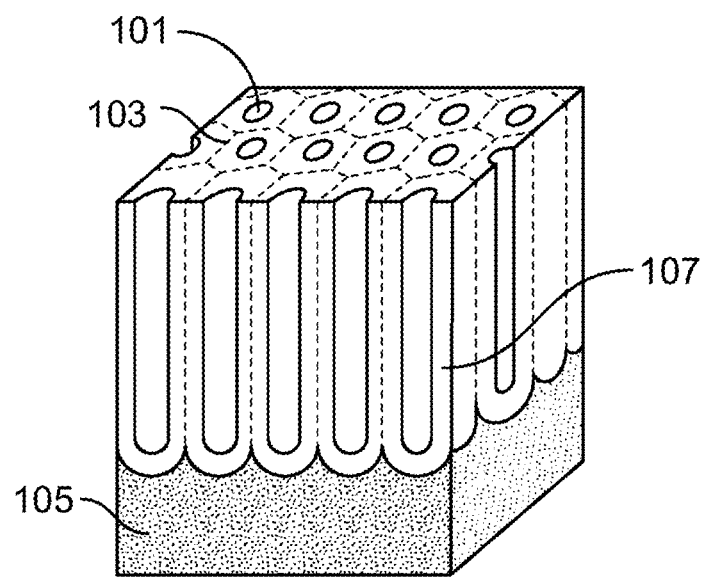
FIG. 1 shows a diagram of porous anodic alumina in accordance with some embodiments.

FIG. 1 shows a model of porous anodic alumina, which is a self-organized material with a structure similar to a honeycomb. Making porous anodic alumina generally involves oxidizing aluminum in an environment that creates pores within the oxidized aluminum. Methods for making porous alumina are well known. Porous anodic alumina is typically formed on top of an aluminum base (105) which is not oxidized. On top of this aluminum base (105) are cells (103) that each contains a hollow pore (101). The walls (107) of the cells (103) are made of anodized aluminum oxide, or alumina. The bases of the cells are also formed of anodized alumina. As shown in FIG. 1, each cell has a test tube-like shape, with a rounded base and high walls. The pores (101) are open at the top. The length of each cell may vary from about 0.1 μm to about 500 μm. In particular, the length of each cell may vary from 30 μm to 100 μm.

Figure 2:
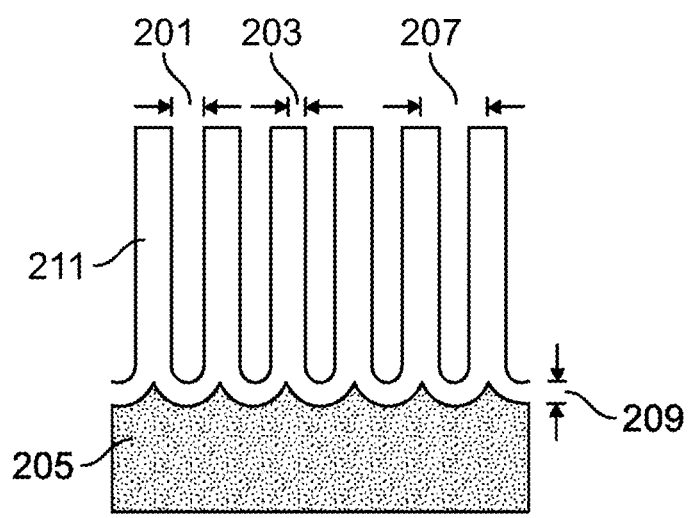
FIG. 2 shows a cross section of the porous alumina atop an aluminum base with various dimensions in accordance with some embodiments.

FIG. 2 shows a cross section of the porous alumina atop an aluminum base with various dimensions specified. As in FIG. 1, on top of the aluminum base (205) are cells that have pores enclosed at their bases and sides by anodized alumina (light gray). The porous alumina portion of this structure is labeled as the Anodized Al (alumina) layer. The base of the cells (209), called the "barrier layer," is made of anodized alumina, as are the walls (211). The barrier layer thickness may vary as a larger pore will require a thicker layer to ensure the pore is completely (and hermetically) sealed. While the barrier layer thickness is dependent on the pore size, the barrier layer thickness may range from about 0.1 nm to 1000 nm.

The size of the cells are defined by the pore diameter (201), wall thickness (203), and interpore distance (207). The pore diameter (201) may vary from about 5 nm to about 500 nm. In particular, the pore diameter (201) may vary from 50 nm to 200 nm. The wall thickness (203) may vary from about 30 nm to about 300 nm and may be dependent on the pore size. The interpore distance (207) may vary from about 65 nm to about 450 nm and may be dependent on the pore size. For example, the wall thickness (203) and interpore distance (207) should be as small as possible while maintaining mechanical strength. The pores are approximately cylindrical, and their width can be defined by the pore diameter (201). The pore diameter (201) may be on the order of tens of nanometers. The wall thickness (203) refers to the wall thickness of a single cell (e.g., cell 103 (FIG. 1)) and may be calculated without including the wall (e.g., wall 107 (FIG. 1)) of the adjoining cell. Thus, the wall thickness (203) is half of the distance between the edges of two adjacent pores. The wall thickness (203) may be on the order of tens of nanometers. The interpore distance (203) refers to the total width of the cell, which is equivalent to the distance between the midpoints of the pores. The height of the pores may be on the order of microns to hundreds of microns.

Porous alumina is suitable for the QD LEDs disclosed herein because it is structurally stable, optically transparent, able to form a hermetic barrier, and/or chemically stable in air and moisture at high temperature and light flux. Other porous materials with similar properties could be used instead of anodic alumina. For example, anodized titanium oxide, anodized tantalum oxide, other valve metal oxides (e.g., niobium oxide, vanadium oxide, hafnium oxide, or tungsten oxide) can be used. Any other porous metal oxides or other porous materials that are structurally stable, transparent, able to form a hermetic barrier, and/or chemically stable in air and moisture at high temperature and light flux may be suitable.

Figure 3:
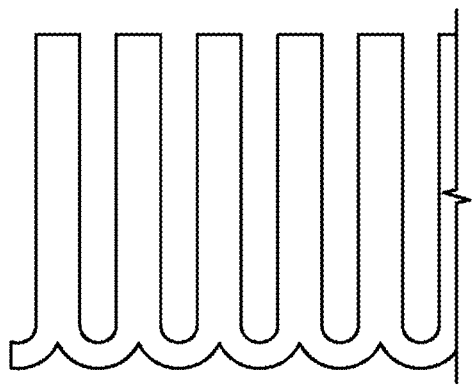
FIGS. 3-6 show exemplary processes for filling quantum dots into the porous anodic alumina and hermetically sealing the quantum dots in accordance with some embodiments.

FIGS. 3-6 show exemplary processes for filling quantum dots into the porous anodic alumina and hermetically sealing the quantum dots. The diameter of the quantum dots may vary from about 1 nm to about 50 nm. In particular, the diameter of the quantum dots may vary from 5 nm to 15 nm. In FIG. 3, the aluminum base has been substantially removed from the structure shown in FIGS. 1 and 2, with the alumina barrier layer and the alumina walls intact. Methods for removing or substantially removing the aluminum base from the porous anodic alumina, leaving the barrier layer and walls intact, are known in the art.

Rather than leaving the alumina barrier layer intact as shown in FIG. 3, the barrier layer may be removed, leaving only the walls (which may be alumina or any other material described above). If the barrier layer is removed, a base layer is added to the porous alumina to create pores with a base and walls. The base layer may be sputtered or deposited in another manner that would seal the bottoms of the pores. The base layer may be made of aluminum oxide, titanium oxide, tantalum oxide, antimony oxide, cerium oxide, indium oxide, indium tin oxide, silicon dioxide, tantalum pentoxide, titanium dioxide, zinc oxide, or other valve metal oxides (e.g., niobium oxide, vanadium oxide, hafnium oxide, or tungsten oxide). The metal oxide may be anodized. Alternatively, any other transparent material that can be sputtered or otherwise deposited to create a hermetic seal with the selected porous material may be used.

Figure 4:
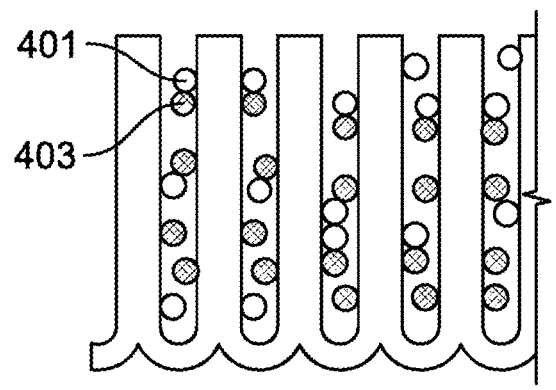
Figure 5:
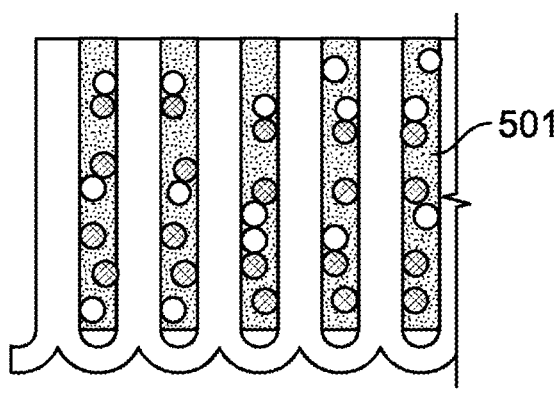

FIGS. 4 and 5 show two alternative ways to load quantum dots into the pores. In FIG. 4, the quantum dots (e.g., red dot 401 and green dot 403 in FIG. 4) are suspended in a solvent and loaded into the pores. The solvent is evaporated out, leaving only the quantum dots. A filler (not shown), such as a polymer, silicone, epoxy, acrylic, imide, or mixture of any of these materials, may be loaded into the pores to fill any empty space remaining after the solvent is evaporated. In FIG. 5, the quantum dots are suspended in a material such as a polymer, silicone, epoxy, acrylic, imide, mixture of any of these materials, or other suitable material. In FIG. 5, the quantum dots are suspended in suspension 501 after suspension 501 is loaded into the pores. After being loaded into the pores, suspension 501 can be dried or cured. A filler (not shown), which may be the materials that may be used for suspension 501, can be loaded into the pores to fill any empty space atop suspension 501. Any material besides quantum dots used to fill the pores, including polymers, epoxies, silicones, acrylics, imides, solvent remaining after evaporation, etc., is referred to herein as a "quantum dot matrix." A quantum dot matrix may generally include any non-light-absorbing material that is compatible with the quantum dots and in which the quantum dots are stable. The quantum dot matrix may improve the structural stability of the quantum dots. The combination of the quantum dots and the quantum dot matrix is referred to herein as "quantum dot material."

The quantum dots may be formed of any photoluminescent semiconductor. Suitable materials for forming quantum dots include CdSe, CdS, CdTe, CdHgTe, HgTe, InP, ZnSe, ZnS, PbSe, PbS, PbTe, CuInP, InPAs, InAs, Cd3P2, Cd3As, CuInS2, CuInSe2, AgInS2, Ge, Ag2S, Ag2Se, and Ag2Te. The quantum dot may be an alloy of multiples of these materials or arranged as a core with one or more shells of these materials or their alloys. In some embodiments, the quantum dot may be comprised of multiple layers, e.g., one material coated in a different material. The quantum dots loaded in the porous material could be the same type, or multiple different types of quantum dots may be deposited. Different types of quantum dots may include quantum dots of different sizes, shapes, materials, and/or structures. For example, a mixture of multiple types of quantum dots may be loaded into all of the pores of the porous material, or different quantum dots or different mixtures of quantum dots may be loaded into different pores or regions of the porous material. Any other fluorophore material that would be aided by protection from humidity and/or oxygen may be used instead of quantum dots.

Figure 6:
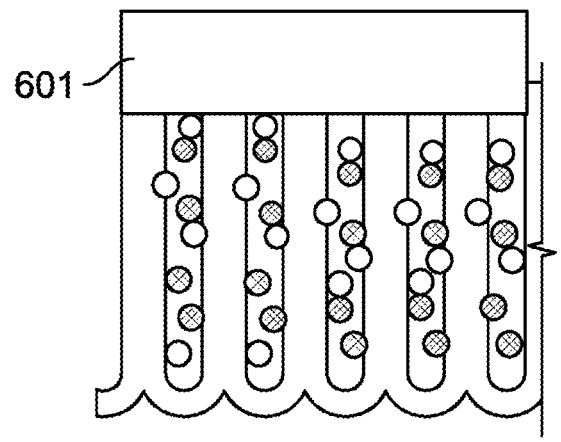

In FIG. 6, metal oxide 601 has been applied to the top of the porous alumina structure. Metal oxide 601 creates a hermetic seal around the pores, such that the quantum dot material is protected from external elements such as moisture or air. Metal oxide 601 may be sputtered or deposited in any manner that creates a hermetic seal over the pores without excessively damaging the porous material, quantum dots, or other pore filling material. Metal oxide 601 may be aluminum oxide, titanium oxide, tantalum oxide, antimony oxide, cerium oxide, indium oxide, indium tin oxide, silicon dioxide, tantalum pentoxide, titanium dioxide, or zinc oxide, or other valve metal oxides (e.g., niobium oxide, vanadium oxide, hafnium oxide, or tungsten oxide). Metal oxide 601 may be anodized. Alternatively, any other transparent material that can be sputtered or otherwise deposited to create a hermetic seal with the selected porous material may be used.

It should be noted that the quantum dots shown in FIGS. 4-6 are not to scale; the quantum dots are typically on the order of nanometers or tens of nanometers. Because of the small size of the quantum dots, the height of the porous material must be thick enough to incorporate enough quantum dots so that enough incoming light hits the quantum dots to convert the frequency to the desired output frequency. As mentioned above, the height of the pores may be on the order of microns to hundreds of microns.

After the hermetically encapsulated quantum dot material has been created, as described above, the material may be cut into pieces and packaged with light emitting diodes. For example, as shown in FIGS. 7 and 8, a piece of the hermetically encapsulated quantum dot material (701) may be placed directly over the LED die (703) in typical LED structures.

Figure 7:
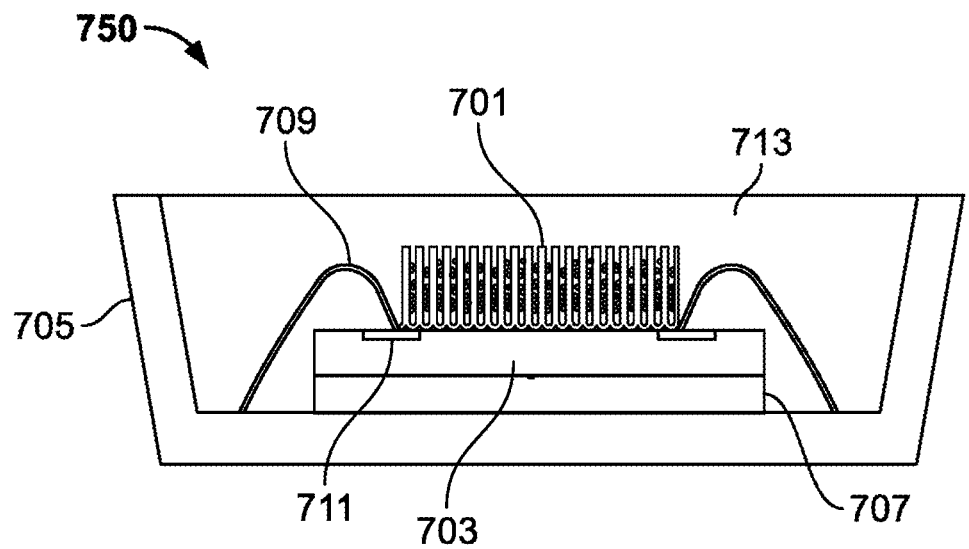
FIG. 7 shows a simplified cross-sectional diagram of an LED package in accordance with some embodiments.

FIG. 7 shows one simplified cross-sectional diagram of an LED package (750). The LED package (750) includes an LED die (703) set on a frame (705) by paste (707). Two wires (709), e.g., gold wires, are attached to electrodes (711) of the LED die (703) to provide charge to the LED. The hermetically sealed quantum dot material (701) is situated on top of the LED die (703). The hermetically sealed quantum dot material (701), LED die (703), and other parts of the LED structure are encapsulated by an encapsulant (713), such as silicone. The quantum dot structure may be placed on the LED die before the encapsulant (713) is added. Alternatively, the hermetically sealed quantum dot material (701) may be placed above the LED die (703) in the LED package (750) after the some or all of the encapsulant (713) is added, but before it is cured. Adding and curing the encapsulant (713) affixes the hermetically sealed quantum dot material (701) in place atop the LED die (703). The hermetically sealed quantum dot material (701) may be placed directly on top of the LED die (703) as shown in FIG. 7, or there may be some encapsulant (713) between the LED die (703) and hermetically sealed quantum dot material (701) (e.g., if encapsulant (713) were deposited on top of the LED die (703) before hermetically sealed quantum dot material (701) is placed in the LED package (750)). In any of these methods, the hermetically sealed quantum dot material (701) is integrated into a standard LED package (750).

Figure 8:
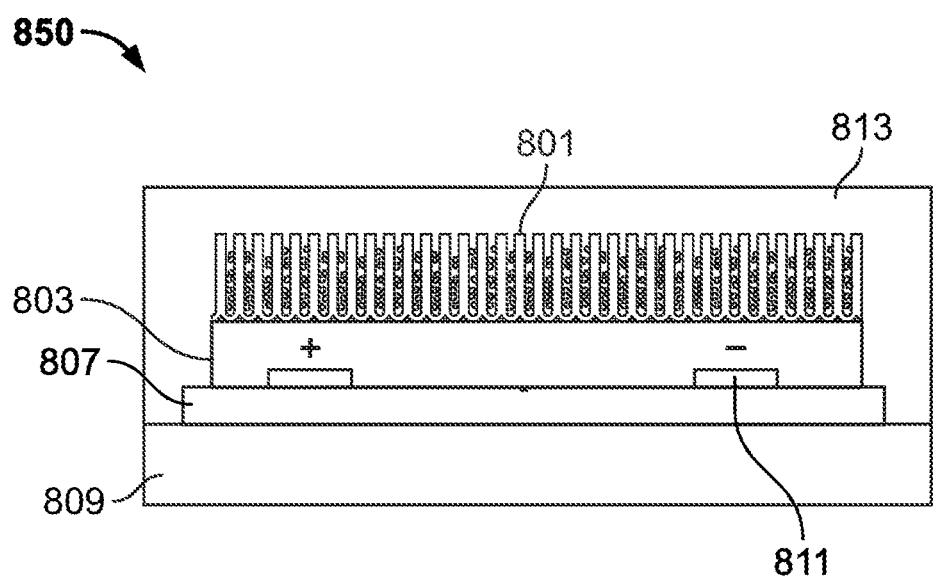
FIG. 8 show another simplified cross-sectional diagram of an LED package in accordance with some embodiments.

FIG. 8 shows a simplified cross-sectional diagram of an alternative LED package (850). In this LED arrangement, the LED die (803) is pasted (by paste 807) to a substrate (809), and the electrodes (e.g., electrode 811) receive charge without the need for wires. As in FIG. 7, the hermetically sealed quantum dot material (801) is situated on top of the LED die (803). The hermetically sealed quantum dot material (801), LED die (803), and other parts of the LED package (850 are encapsulated by an encapsulant (813), such as silicone, using any of the methods described with respect to FIG. 7. Thus, the hermetically sealed quantum dot material (801) is integrated into the LED package (850), either directly on top of the LED die (803) as pictured, or with some encapsulant (813) between the LED die (803) and the hermetically sealed quantum dot material (801).

The LED structures shown in FIGS. 7 and 8 are exemplary. In some embodiments, the hermetically sealed quantum dot structure may be incorporated into any suitable LED package. The width and depth of the hermetically sealed quantum dot structure can be cut as needed for LED packages of different sizes and dimensions. For example, the quantum dot structure could be a similar size to the LED die or LED package, or could be proportional to the size of the LED die or LED package. The height of the hermetically sealed quantum dot structure is typically on the order of tens of microns, which is on the order of standard silicone LED packaging. Thus, the hermetically sealed quantum dot structure is thin enough to be incorporated on top of a LED die and covered in an encapsulant. Rather than incorporating the quantum dot structure directly into the LED package, as shown in FIGS. 7 and 8, the quantum dot structure may be positioned on top of the encapsulant. In such embodiments, the LED die and the rest of the LED package are encapsulated, and the quantum dot structure is affixed atop the LED package by affixing the quantum dot structure to the cured encapsulant. As another alternative, the quantum dot structure may be independent from the LED package, e.g., as a separate layer that spans across one or multiple LED packages. Even if the quantum dot structure were placed outside of the LED package, it would still protect the quantum dots within the structure from oxygen and moisture.

In some embodiments, when the quantum dots are struck by light from the LED, some of the quantum dots emit a pure red light, and other quantum dots emit a pure green light. If the source LED emits blue light, then a combination of red, green, and blue light will be emitted from the QD LED structure, creating a pure white light. This white light can be used for stand-alone LEDs, or the light may be selectively filtered to create color displays. The QD LEDs disclosed herein can be used for any application in which other types of LEDs are used. Furthermore, the quantum dots can be selected to produce any desired frequency or combination of frequencies.

What is claimed is:

1. A system comprising:
    a light emitting diode (LED) die;
    a porous material having a plurality of pores positioned on top of the light emitting diode die;
    a quantum dot material deposited within the plurality of pores of the porous material;
    a sealant, disposed over the quantum dot material and the porous material, for hermetically sealing the quantum dot material within the plurality of pores; and
    LED packaging for housing the light emitting diode die, the porous material, the quantum dot material, and the sealant in a single unit.

2. The system of claim 1, wherein the porous material is porous anodic alumina.

3. The system of claim 2, wherein the porous anodic alumina comprises a barrier layer and walls.

4. The system of claim 1, wherein the quantum dot material comprises a plurality of quantum dots suspended in at least one of a silicone, polymer, or epoxy.

5. The system of claim 1, wherein the quantum dot material was formed by:
    loading a quantum dot solution, comprising a solvent and a plurality of quantum dots, into the plurality of pores; and
    evaporating the solvent.

6. The system of claim 1, wherein the sealant comprises a metal oxide.

7. The system of claim 1, wherein:
    the quantum dot material comprises red quantum dots and green quantum dots;
    the light emitting diode die emits a blue light; and
    the system emits a white light.

8. A method for producing an LED, the method comprising:
    loading a plurality of quantum dots into a porous material;
    hermetically sealing the quantum dots within the porous material;
    positioning the porous material with the hermetically sealed quantum dots above an LED die; and
    encapsulating the LED die and the porous material with the hermetically sealed quantum dots in a single LED package.

9. The method of claim 8, wherein loading the plurality of quantum dots into the porous material comprises:
    forming a quantum dot suspension by suspending the plurality of quantum dots into a suspension material;
    loading the quantum dot suspension into a plurality of pores of the porous material; and
    curing the quantum dot suspension.

10. The method of claim 8, wherein loading the plurality of quantum dots into the porous material comprises:
    forming a quantum dot solution comprising the plurality of quantum dots and a solvent;
    loading the quantum dot solution into a plurality of pores of the porous material; and
    evaporating the solvent from the plurality of pores of the porous material.

11. The method of claim 10, wherein loading the plurality of quantum dots into the porous material further comprises loading a filler material into the plurality of pores.

12. The method of claim 8, further comprising cutting the porous material with the hermetically sealed quantum dots based on a size of the LED die.

13. A method for producing hermetically sealed quantum dots, the method comprising:
    loading a plurality of quantum dots into porous anodic alumina comprising a plurality of pores each having an opening, wherein loading the plurality of quantum dots into the porous anodic alumina comprising the plurality of pores comprises:
        forming a quantum dot suspension by suspending the plurality of quantum dots into a suspension material;
        loading the quantum dot suspension into the plurality of pores of the porous anodic alumina; and
        curing the quantum dot suspension;
    and
    sputtering a metal oxide over the openings of the plurality of pores of the porous anodic alumina loaded with quantum dots, such that the quantum dots are hermetically sealed within the plurality of pores.

14. The method of claim 13, wherein loading the plurality of quantum dots into the porous anodic alumina comprising the plurality of pores comprises:
    forming a quantum dot solution comprising the plurality of quantum dots and a solvent;
    loading the quantum dot solution into the plurality of pores of the porous anodic alumina;
    and
    evaporating the solvent from the plurality of pores of the porous anodic alumina.

15. The method of claim 14, wherein loading the plurality of quantum dots into the porous anodic alumina comprising the plurality of pores further comprises loading a filler material into the plurality of the pores.

16. A system comprising:
    a porous material having a plurality of pores;
    a quantum dot material deposited within the plurality of pores of the porous material; and
    a sealant, disposed over the quantum dot material and the porous material, for hermetically sealing the quantum dot material within the plurality of pores; and
    a light emitting diode (LED) packaging for housing the light emitting diode die, the porous material, the quantum dot material, and the sealant in a single unit.

17. The system of claim 16, further comprising a light emitting diode die, wherein the porous material is positioned on top of the light emitting diode.

18. The system of claim 16 or 17, wherein the porous material is porous anodic alumina.

19. The system of claim 16, wherein the porous anodic alumina comprises a barrier layer and walls.

20. The system of claim 16, wherein the quantum dot material comprises a plurality of quantum dots suspended in at least one of a silicone, polymer, or epoxy.

21. The system of claim 16, wherein the quantum dot material was formed by:
loading a quantum dot solution, comprising a solvent and a plurality of quantum dots, into the plurality of pores; and
evaporating the solvent.

22. The system of claim 16, wherein the sealant comprises a metal oxide.

23. The system of claim 16, wherein:
the quantum dot material comprises red quantum dots and green quantum dots;
the light emitting diode die emits a blue light; and
the system emits a white light.

24. A method for producing hermetically sealed quantum dot material, the method comprising:
loading a plurality of quantum dots into a porous material;
hermetically sealing the quantum dots within the porous material; and
encapsulating the porous material with the hermetically sealed quantum dots in a package.

25. The method of claim 24, further comprising positioning the porous material with the hermetically sealed quantum dots above an LED die, wherein the LED die is encapsulated in the package with the porous material with the hermetically sealed quantum dots.

26. The method of claim 24 or 25, wherein loading the plurality of quantum dots into the porous material comprises:
forming a quantum dot suspension by suspending the plurality of quantum dots into a suspension material;
loading the quantum dot suspension into a plurality of pores of the porous material; and
curing the quantum dot suspension.

27. The method of claim 24, wherein loading the plurality of quantum dots into the porous material comprises:
forming a quantum dot solution comprising the plurality of quantum dots and a solvent;
loading the quantum dot solution into a plurality of pores of the porous material; and
evaporating the solvent from the plurality of pores of the porous material.

28. The method of claim 24, wherein loading the plurality of quantum dots into the porous material further comprises loading a filler material into the plurality of pores.

29. The method of claim 24, further comprising cutting the porous material with the hermetically sealed quantum dots based on a size of the package.

30. A method for producing hermetically sealed quantum dots, the method comprising:
loading a plurality of quantum dots into a material comprising a plurality of pores each having an opening, wherein loading the plurality of quantum dots into the material comprises:
forming a quantum dot suspension by suspending the plurality of quantum dots into a suspension material;
loading the quantum dot suspension into the plurality of pores of the material; and
curing the quantum dot suspension;
and
sputtering a metal oxide over the openings of the plurality of pores of the material loaded with quantum dots, such that the quantum dots are hermetically sealed within the plurality of pores.

31. The method of claim 30, wherein the material comprises porous anodic alumina.

32. The method of claim 30, wherein loading the plurality of quantum dots into the material comprises:
forming a quantum dot solution comprising the plurality of quantum dots and a solvent; loading the quantum dot solution into the plurality of pores of the material; and
evaporating the solvent from the plurality of pores of the material.

33. The method of claim 30, wherein loading the plurality of quantum dots into the material comprises loading a filler material into the plurality of the pores.

* * * * *